(12) United States Patent
Salazar

(10) Patent No.: US 10,923,869 B2
(45) Date of Patent: Feb. 16, 2021

(54) VEHICLE HARNESS CONNECTOR INTERFACE ASSEMBLIES

(71) Applicant: Toyota Motor Engineering & Manufacturing North America, Inc., Plano, TX (US)

(72) Inventor: Jeffrey Salazar, Hamtramck, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 0 days.

(21) Appl. No.: 16/435,968

(22) Filed: Jun. 10, 2019

(65) Prior Publication Data
US 2020/0388973 A1 Dec. 10, 2020

(51) Int. Cl.
*H01R 13/60* (2006.01)
*H01R 31/00* (2006.01)

(52) U.S. Cl.
CPC ....... *H01R 31/005* (2013.01); *H01R 2201/26* (2013.01)

(58) Field of Classification Search
CPC .......................... H01R 31/005; H01R 2201/26
USPC ......................................................... 439/533
See application file for complete search history.

(56) References Cited

U.S. PATENT DOCUMENTS

| | | | | |
|---|---|---|---|---|
| 4,521,062 A | * | 6/1985 | Kurbikoff | H01R 13/6595 439/101 |
| 4,850,884 A | * | 7/1989 | Sawai | B60R 16/0239 439/76.2 |
| 4,956,561 A | * | 9/1990 | Tamer | H01R 13/665 174/541 |
| 5,124,888 A | * | 6/1992 | Suzuki | H05B 41/02 361/740 |
| 5,244,397 A | * | 9/1993 | Anhalt | G06K 7/0047 439/101 |

(Continued)

FOREIGN PATENT DOCUMENTS

| | | |
|---|---|---|
| CN | 105270293 A | 1/2016 |
| CN | 103399569 B | 5/2016 |
| CN | 205256241 U | 5/2016 |

OTHER PUBLICATIONS

"DIN Signal Shell Housing C15", Harting Technology Group, Apr. 2019, URL: https://b2b.harting.com/ebusiness/en_us/DIN-Signal-shell-housing-C15/09030960504.

*Primary Examiner* — Abdullah A Riyami
*Assistant Examiner* — Vladimir Imas
(74) *Attorney, Agent, or Firm* — Dinsmore & Shohl LLP

(57) ABSTRACT

Embodiments described herein generally relate to a connector interface assembly. The connector interface assembly includes a housing and a printed circuit board. The housing includes a first side part and a second side part. The printed circuit board includes a first end having a connector, an opposite second end having a first receiving port, and an upper surface having a second receiving port and a pair of coaxial ports extending therefrom. The second receiving port and the pair of coaxial ports of the upper surface extend in a direction perpendicular to the connector and the first receiving port. The connector is different from the first receiving port. The printed circuit board is positioned between the first side part and the second side part such that the housing at least partially surrounds the printed circuit board in a between the first and second side parts.

12 Claims, 3 Drawing Sheets

(56) References Cited

U.S. PATENT DOCUMENTS

| | | | | |
|---|---|---|---|---|
| 5,266,051 A * | 11/1993 | Chupak | H01R 13/5205 | 439/273 |
| 5,306,156 A * | 4/1994 | Gibbs | B60Q 1/302 | 224/315 |
| 5,344,340 A * | 9/1994 | Bouleau | H01R 24/50 | 439/581 |
| 5,431,570 A * | 7/1995 | Gibbs | B60Q 1/302 | 224/315 |
| 5,764,487 A * | 6/1998 | Natsume | B60R 16/0238 | 174/72 B |
| 5,823,798 A * | 10/1998 | Zintler | B60R 16/0238 | 439/76.2 |
| 5,877,703 A * | 3/1999 | Bloss, Jr. | G01D 4/004 | 340/870.02 |
| 5,902,138 A * | 5/1999 | Murakami | H01R 9/2466 | 439/76.2 |
| 5,967,808 A * | 10/1999 | Kubota | H01R 13/62911 | 439/157 |
| 5,971,796 A * | 10/1999 | Duhr | H01R 13/516 | 439/364 |
| 5,975,935 A * | 11/1999 | Yamaguchi | H01R 13/73 | 439/374 |
| 6,000,952 A * | 12/1999 | Gladd | H01R 9/2466 | 361/736 |
| 6,218,740 B1 * | 4/2001 | Mildice | H01R 31/005 | 307/10.1 |
| 6,418,853 B1 * | 7/2002 | Duguet | F42B 3/121 | 102/202.2 |
| 6,752,632 B1 * | 6/2004 | Anderson | H01R 13/502 | 174/66 |
| 6,768,647 B1 * | 7/2004 | Kowtun | H01R 12/718 | 361/752 |
| 6,921,292 B2 * | 7/2005 | Miyazaki | H01R 9/032 | 439/564 |
| 7,252,513 B1 * | 8/2007 | Hildebrand | H01Q 1/1214 | 439/581 |
| 7,341,484 B2 * | 3/2008 | Yamamoto | H01R 13/5202 | 439/271 |
| 7,396,254 B2 * | 7/2008 | Harmelink | H01R 13/518 | 439/540.1 |
| 7,458,824 B2 * | 12/2008 | Ogawa | H05K 7/026 | 439/76.1 |
| 7,488,185 B2 * | 2/2009 | Hashikura | H05K 7/026 | 439/76.2 |
| 7,614,886 B2 * | 11/2009 | Choi | H01R 9/2466 | 439/620.27 |
| 7,682,183 B2 * | 3/2010 | Kanazawa | H01R 9/2408 | 439/357 |
| 7,775,807 B2 * | 8/2010 | Yamaguchi | H01R 13/5227 | 439/76.2 |
| 7,813,876 B2 * | 10/2010 | Gasbarro | H04B 1/082 | 701/491 |
| 7,819,004 B2 * | 10/2010 | Steele | B60R 21/01 | 73/493 |
| 7,942,474 B2 * | 5/2011 | Jones | B60R 11/0264 | 180/90 |
| 7,955,133 B2 * | 6/2011 | Scheele | H05K 7/026 | 361/626 |
| 7,967,617 B2 * | 6/2011 | Vonnegut | H01R 13/6658 | 439/142 |
| 8,027,168 B2 * | 9/2011 | Senk | B60R 16/0238 | 174/387 |
| 8,112,196 B2 * | 2/2012 | Takayanagi | B60T 8/368 | 361/752 |
| 8,212,145 B2 * | 7/2012 | Nagai | B60R 16/0239 | 174/59 |
| 8,267,702 B2 * | 9/2012 | De La Reza | B60R 16/0238 | 439/76.1 |
| 8,416,575 B2 * | 4/2013 | Sato | H01R 9/226 | 174/260 |
| 8,466,586 B2 * | 6/2013 | Tarchinski | B60K 6/46 | 307/328 |
| 8,627,564 B2 * | 1/2014 | Blossfeld | H01R 12/00 | 29/883 |
| 8,728,642 B2 * | 5/2014 | Maskew | B60L 3/0084 | 429/61 |
| 8,749,991 B2 * | 6/2014 | Zielinski | H04B 1/082 | 361/799 |
| 8,848,356 B2 * | 9/2014 | Wotton | B62J 11/00 | 361/679.31 |
| 8,904,633 B2 * | 12/2014 | Blossfeld | H01R 12/00 | 29/884 |
| 8,936,474 B2 * | 1/2015 | Katsuse | H01R 9/223 | 439/701 |
| 8,986,046 B2 * | 3/2015 | Smith | B60R 21/017 | 439/620.22 |
| 9,293,867 B2 * | 3/2016 | Rouchaud | H01R 13/6658 | |
| 9,681,571 B2 * | 6/2017 | Hansen | H05K 7/1432 | |
| 9,966,707 B2 * | 5/2018 | Hildebrand | H01Q 1/1214 | |
| 9,972,986 B2 * | 5/2018 | Ikeda | H01R 9/2416 | |
| 10,010,006 B2 * | 6/2018 | Tanaka | H05K 5/0069 | |
| 10,128,595 B2 * | 11/2018 | Conger | H01R 27/02 | |
| 10,326,236 B1 * | 6/2019 | Harmelink | H01R 13/5219 | |
| 10,377,198 B1 * | 8/2019 | Fields | B60D 1/64 | |
| 2005/0075768 A1 | 4/2005 | Nicholson et al. | | |
| 2010/0244871 A1 * | 9/2010 | Blair | H05K 1/112 | 324/756.05 |
| 2011/0254575 A1 * | 10/2011 | Uesaka | H01R 12/714 | 324/754.11 |
| 2014/0273550 A1 * | 9/2014 | Biddle | H01R 24/50 | 439/63 |
| 2015/0057874 A1 | 2/2015 | Jones | | |
| 2018/0108971 A1 * | 4/2018 | Connor | H01P 11/006 | |
| 2020/0039448 A1 * | 2/2020 | Lu | B60R 11/04 | |

* cited by examiner

VEHICLE HARNESS CONNECTOR INTERFACE ASSEMBLIES

TECHNICAL FIELD

The present specification generally relates to harness interfaces and, more specifically, to vehicle harness connector interface assemblies that have common junction features for use in obtaining multiple signals from vehicles.

BACKGROUND

Automotive OEMs exert great effort to test or benchmark automotive vehicles to obtain certain operating performances, such as engine torque parameters, fuel efficiency parameters, and the like. Each automotive vehicle may use different harness connections to communicate between the systems and modules of the vehicle. In order to test or benchmark the operating performances of the various vehicles, custom harness connections need to be fabricated to match that of each vehicle such that the data may be extracted from the various harness connections and modules.

Accordingly, there is a need for a common harness interface that is configured to connect to modules of the various automotive vehicles without the need for modifying the interface or creating custom harnesses.

SUMMARY

A connector interface assembly is provided. The connector interface assembly includes a housing and a printed circuit board. The housing includes a first side part and a second side part. The printed circuit board includes a first end having a connector, an opposite second end having a first receiving port, and an upper surface having a second receiving port and a pair of coaxial ports extending therefrom. The second receiving port and the pair of coaxial ports of the upper surface extend in a direction perpendicular to the connector and the first receiving port. The connector is different from the first receiving port. The printed circuit board is positioned between the first side part and the second side part such that the housing at least partially surrounds the printed circuit board between the first side part and the second side part.

These and additional objects and advantages provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Embodiments described herein generally relate to a connector interface assembly that is a common junction for benchmark testing between a plurality of modules and connectors generally found within a vehicle. That is, the connector interface assembly is configured to connect to a plurality of vehicle types for testing purposes without the need to modify testing modules and/or the need to create custom harness connections for each type of vehicle. The connector interface assembly includes a printed circuit board (PCB) at least partially surrounded by a first side part and a second side part of a housing. The PCB includes a first end that has a connector, a second end that has a first receiving port, and an upper surface that further includes a second receiving port and a pair of coaxial ports. The second receiving port and the pair of coaxial ports of the upper surface of the PCB are perpendicular to the connector and the first receiving port.

The connector is configured to communicate with a data acquisition (DAQ) module or hardware external to the vehicle. The first receiving port is configured to receive signals from a vehicle datalink connector (DLC) that is onboard the vehicle. The second receiving port is a serial port configured to communicatively couple to an in-vehicle module, such as a DAQ module or a mini-module, that is onboard the vehicle. The second receiving port extracts a plurality of analog signals from the in-vehicle module and transmits the analog signals to the connector. The pair of coaxial ports is communicatively coupled to a vehicle electronic control unit, module, or the like to receive unfiltered Controller Area Network (CAN) signals from the vehicle.

Figure 1:
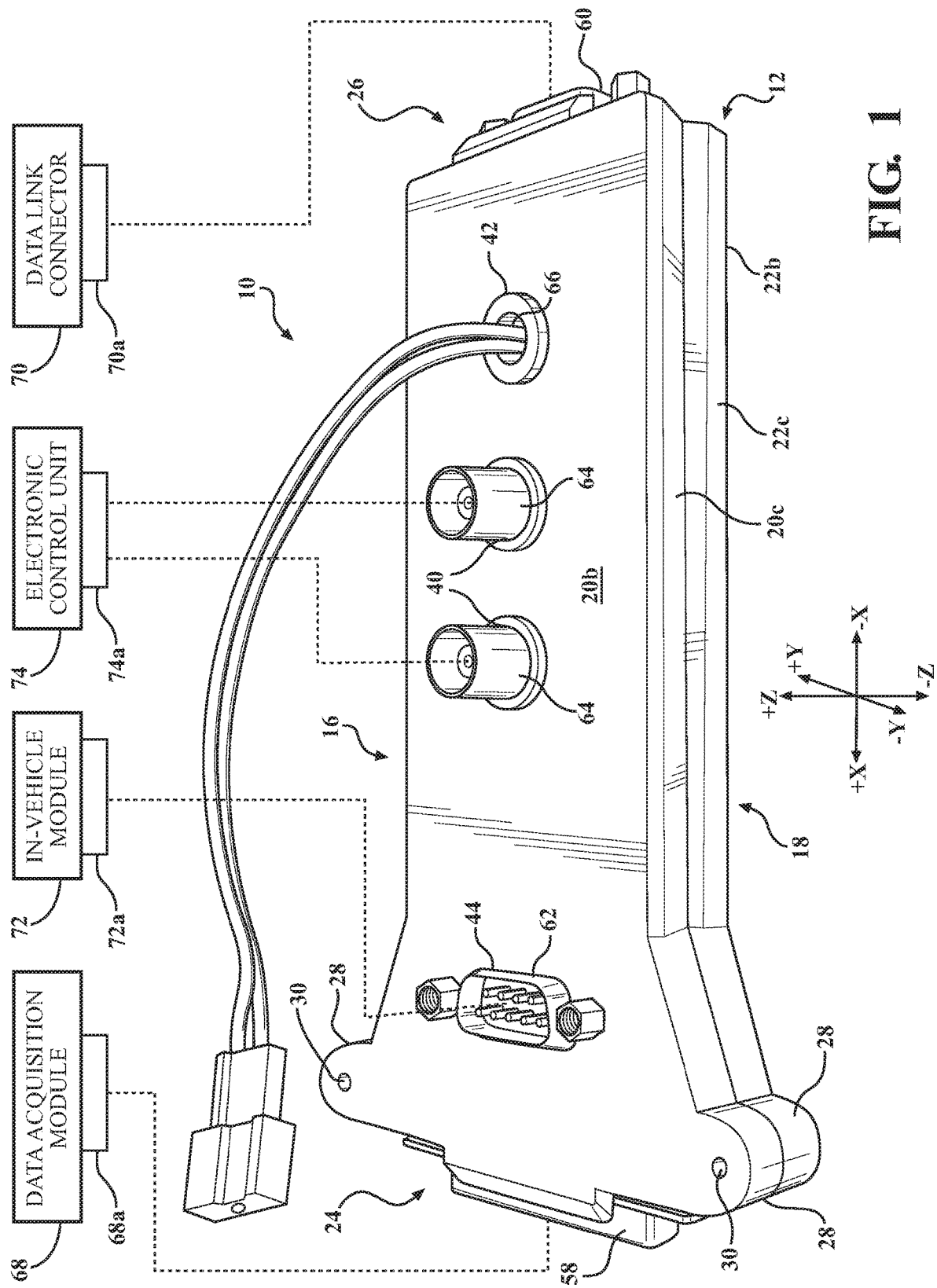
FIG. 1 schematically depicts a perspective view of a connector interface assembly, according to one or more embodiments shown or described herein.

As used herein, the term "longitudinal direction" refers to the forward-rearward direction (i.e., in the +/− vehicle X direction depicted in FIG. 1). The term "lateral direction" refers to the cross direction (i.e., in the +/− vehicle Y direction depicted in FIG. 1), and is transverse to the longitudinal direction. The term "vertical direction" refers to the upward-downward direction (i.e., in the +/− vehicle Z-direction depicted in FIG. 1).

Figure 2:
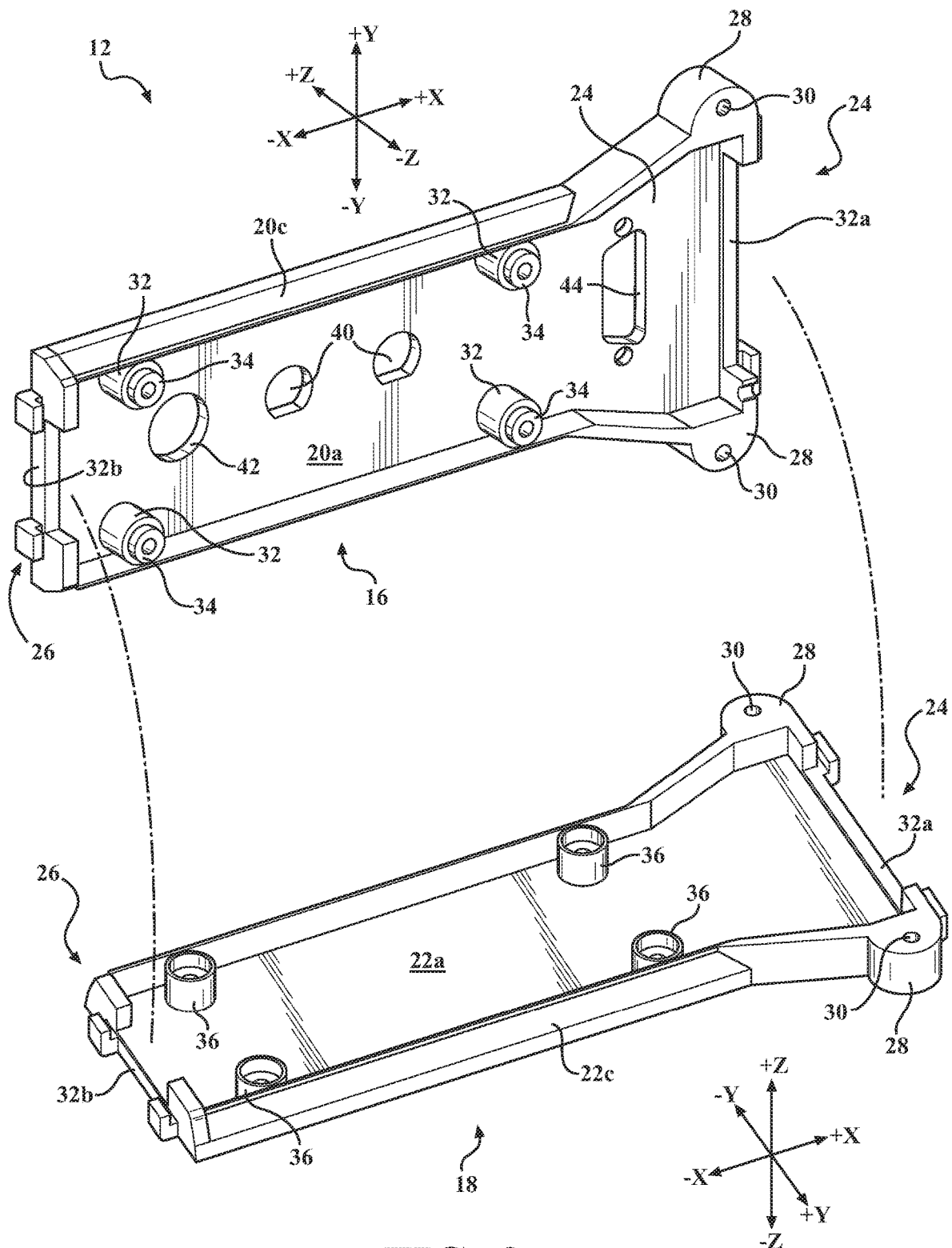
FIG. 2 schematically depicts a first side part and a second side part of a housing of the connector interface assembly of FIG. 1, according to one or more embodiments shown or described herein.
Figure 3:
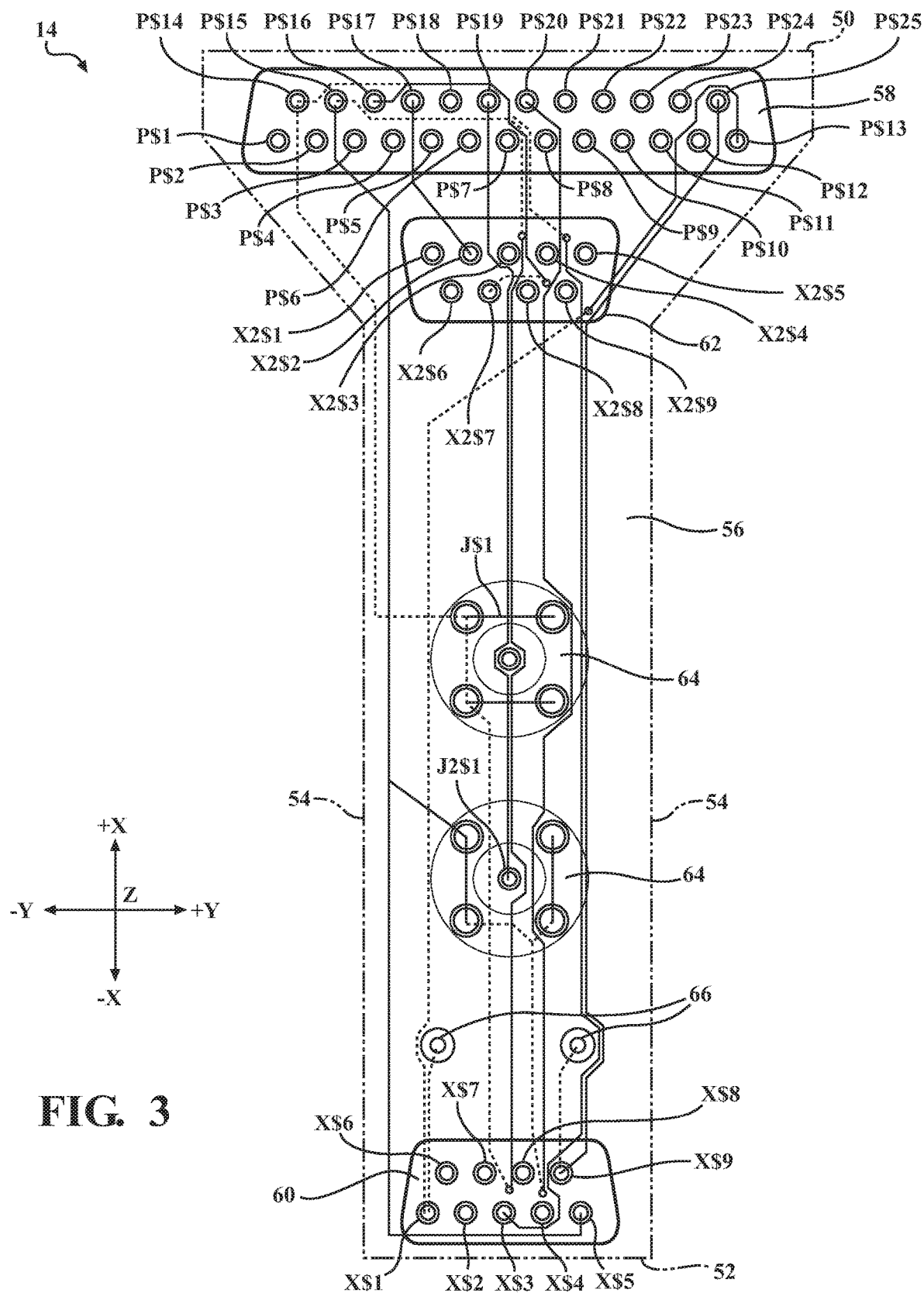
FIG. 3 schematically depicts a top view of a printed circuit board and connectors of connector interface assembly of FIG. 1, according to one or more embodiments shown or described herein.

Referring to FIGS. 1-3, a connector interface assembly 10 will now be described. The connector interface assembly 10 includes a housing 12 and a printed circuit board (PCB) 14. The housing 12 includes a first side part 16 and a second side part 18. In some embodiments, the first side part 16 and the second side part 18 are each formed as corresponding halves of the housing 12. The first side part 16 includes an inner surface 20a and an opposite outer surface 20b. A flange portion 20c extends at least partially around an outer peripheral of the first side part 16. The second side part 18 includes an inside surface 22a and an opposite outside surface 22b. A flange portion 22c extends at least partially around an outer peripheral of the second side part 18.

The first side part 16 and second side part 18 connect to form a first end portion 24 and an opposite second end portion 26 of the housing 12. In embodiments, the first end portion 24 is flared outwardly compared to the second end portion 26. It should be appreciated that the flange portions 20c, 22c extend outwardly at an obtuse angle with respect to the second end portion 26. In other embodiments, the first end portion 24 and the second end portion 26 are equally sized. The first end portion 24 further includes engagement members 28 disposed at an apex of the first end portion 24. Each of the engagement members 28 have a bore 30 configured for a fastener such as a bolt, a screw, a rivet, and the like such that the first side part 16 may be attached to the second side part 18 in a closed configuration to form the housing 12. It should be appreciated that the engagement members 28 and each bore 30 of the first side part 16 align with or compliment the engagement members 28 and each bore 30 of the second side part 18 such that the fastener extends through each bore 30 of the engagement members 28 of the first side part 16 into the second side part 18 and vice versa.

The first side part 16 further includes a plurality of bosses 32 extending from the inner surface 20a. In some embodiments, each of the plurality of bosses 32 is circular. In other embodiments, the plurality of bosses 32 may be other shapes such as rectangular, triangular, square, rhomboid, and/or the like. Further, in some embodiments, each of the plurality of bosses 32 are annularly stepped at an engagement portion 34 to be received in a receiving cavity for alignment purposes.

The second side part 18 includes a plurality of receiving collars 36 extending from the inside surface 22a. The plurality of receiving collars 36 are configured to receive the plurality of bosses 32 of the first side 16. In some embodiments, the plurality of receiving collars 36 is configured to receive the engagement portion 34 of the plurality of bosses 32. It is appreciated that the plurality of receiving collars 36 assist in aligning the first side part 16 to the second side part 18 in the lateral direction (i.e., in the +/−Y-direction) and in the longitudinal direction (i.e., in the +/−X-direction) by receiving the plurality of bosses 32 of the first side part 16. As such, the plurality of receiving collars 36 generally compliment the plurality of bosses 32 in both location on the inside surface 22a of the second side part 18 and in shape such that the plurality of receiving collars 36 concentrically align with the plurality of bosses 32 in the vertical direction (i.e., in the +/−Z-direction). In some embodiments, the plurality of receiving collars 36 may have a different shape than that of the plurality of bosses 32.

It is appreciated that in some embodiments, the plurality of receiving collars 36 assists in maintaining a position of the PCB 14 with respect to the second side part 18. That is, the PCB 14 may be positioned between the plurality of receiving collars 36 such that an outer edge of the PCB 14 makes contact with the outer surface of the plurality of receiving collars 36, which in turn prevents the PCB 14 form shifting or moving towards the flange portions 20c, 22c in the lateral direction (i.e., in the +/−Y-direction) and/or the first and second end portions 24, 26 in the longitudinal direction (i.e., in the +/−X-direction).

The flange portions 20c, 22c of the first and second side parts 16, 18, respectively, may terminate at respective proximate and distal ends of the first and second end portions 24, 26. The termination of the flange portions 20c, 22c provide for a first opening 32a at the first end portion 24 of the housing 12 and a second opening 32b at the second end portion 26 of the housing 12 when the first side part 16 and the second side part 18 are joined or connected in the closed configuration to form the housing 12. As such, the first and second openings 32a, 32b permit for electrical components, such as connectors, ports, and the like, to be communicatively coupled to the PCB 14 and protrude from the hosing 12, as discussed in greater detail herein.

As best seen in FIG. 2, the first side part 16 of the housing 12 further includes a pair of coaxial port apertures 40, a power aperture 42 and a second port aperture 44, each of which extends between the inner surface 20a and the opposite outer surface 20b of the first side part 16. It is appreciated that the pair of coaxial port apertures 40, the power aperture 42 and the second port aperture 44 are disposed in the first side part 16 perpendicular to the first and second openings 32a, 32b. It is also appreciated that the pair of coaxial port apertures 40, the power aperture 42 and the second port aperture 44 are configured for electrical components, such as connectors, ports, and the like, to be communicatively coupled to the PCB 14 and protrude from the first side part 16 when the first side part 16 and the second side part 18 are joined or connected in the closed configuration to form the housing 12, as discussed in greater detail herein.

In some embodiments, the first and second side parts 16, 18 of the housing 12 are formed of a polymer material such as Polyether ether ketone (PEEK). In other embodiments, the first and second side parts 16, 18 of the housing 12 is another polymer or a resin. In still other embodiments, the first and second side parts 16, 18 of the housing 12 may be any material appreciated by one skilled in the art that is capable of housing the PCB 14 to perform any of the embodiments described herein.

Referring to FIG. 3, an illustrative top down view of the PCB 14 and circuit schematic is depicted. The PCB 14 includes a first end 50, an opposite second end 52, and a pair of side edges 54 that extend between the first end 50 and the second end 52 to define an upper surface 56 of the PCB 14. In some embodiments, the first end 50 may be a front-end edge and the second end 52 may be a rear end edge such that the pair of side edges 54 connects the front-end edge to the rear end edge to form an upper surface 56. In some embodiments, the upper surface 56 may generally be planar.

A connector 58 is communicatively coupled to the first end 50 of the PCB 14. A first receiving port 60 is communicatively coupled to the second end 52. A second receiving port 62, a pair of coaxial ports 64, and a power connector 66 are communicatively coupled to and extend from the upper surface 56 of the PCB 14 from between the connector 58 and the first receiving port 60. The second receiving port 62, the pair of coaxial ports 64, and the power connector 66 are coupled to the PCB in a direction generally perpendicular to the direction of the connector 58 and the first receiving port 60. In embodiments, the connector 58 is a 25-pin D-shape connector commonly known as a DB-25 connector. It is appreciated that the connector 58 includes pin layout herein designated by pin numbers P$1-P$25. It should also be appreciated that this is a non-limiting example and other layouts are conceived. The first receiving port 60 and the second receiving port 62 are both 9-pin D-shape connectors commonly known as DE-9 connectors. It is appreciated that the first receiving port 60 includes a pin layout herein designated by pin numbers X$1-X$9 and the second receiving port 62 includes a pin layout herein designated by pin numbers X2$1-X2$9. It should be appreciated that this is a non-limiting example and other layouts are conceived. As such, it should also be appreciated that the connector 58 is different from the first receiving port 60 and the second receiving port 62. Further, each of the pair of coaxial ports 64 includes pin layout herein designated by pin numbers J$1 and J2$1 respectively. It should be appreciated that each of the pair of coaxial ports 64 may include additional pins however, only the connection pin is described herein with the understanding that the additional pins are communicatively coupled to J$1 and J2$1 respectively.

In embodiments, the first receiving port 60, the second receiving port 62, the pair of coaxial ports 64, and the power connector 66 are communicatively coupled to the connector 58. For example, the first receiving port 60 may be communicatively coupled to the connector 58 via input pin X$9 of the first receiving port 60, which then transmits the signal to input pin P$25 of the connector 58, input pin X$5 of the first receiving port 60, which transmits the signal to input pin P$15 of the connector 58, and input pin X$3 of the first receiving port 60, which transmits the signal to input pin P$14 of the connector 58. It should be appreciated that, in embodiments, the first receiving port 60 may be configured to receive and output high speed CAN signals. As such, input pin P$14 and pin P$15 of the connector 58 are configured to receive and transmit high-speed CAN signals. In embodiments, input pin P$14 receives and transmits CAN low signals and pin P$15 receives and transmits CAN high signals.

The second receiving port 62 may be communicatively coupled to the connector 58 via input pin X2$2 of the second receiving port 62, which then transmits the signal to input pin P$17 of the connector 58 and input pin X2$7 of the second receiving port 62, which transmits the signal to input pin P$16 of the connector 58. It should be appreciated that the second receiving port 62 is configured to receive and output analog signals. As such, input pin P$16 and pin P$17 of the connector 58 are configured to receive and transmit analog signals.

Each of the pair of coaxial ports 64 may be communicatively coupled to the connector 58. For example, input pin J$1 receives a signal and transmits the signal to input pins P$14 and P$15 of the connector 58 and input pin J$2 receives a signal and transmits the signal to input pins P$19 and P$20 of the connector 58. As such, J$1 of the pair of coaxial ports 64 is a high speed CAN signal port that is capable or configured to receives and transmits CAN low signals to P$14 and receives and transmits CAN high signals to pin P$15.

Further, in embodiments, the first receiving port 60, the second receiving port 62, the pair of coaxial ports 64, and the power connector 66 are communicatively coupled to a common ground. For example, the first receiving port 60 is communicatively coupled to ground of the power connector 66 via input pin X$1 of the first receiving port 60 and to input P$13 of the connector 58. It is appreciated that the power connector 66 may include both power and ground cables. Further, the power connector 66 may connect to a power source and/or a ground located outside of the connector interface assembly 10. For example, the power connector 66 may connect to a battery and/or a power module.

In some embodiments, the PCB 14 is a multilayered PCB, as schematically depicted in FIG. 3. As such, some of the traces, wires, connectors and the like of the PCB 14 may be disposed on separate layers of the PCB 14 in the vertical direction (i.e., in the +/−Z-direction). That is, as illustrated best in FIG. 3, traces of the PCB 14 are illustrated as a dashed line and a solid line where the traces that are located on a lower layer of the PCB 14 are dashed and the traces that are located on an upper of the PCB 14 are a solid line. It should be appreciated that the traces may communicatively couple the first receiving port 60, the second receiving port 62, the pair of coaxial ports 64, and the power connector 66 are communicatively coupled to the connector 58. Further, it should be appreciated that the traces communicatively coupling the first receiving port 60, the second receiving port 62, the pair of coaxial ports 64, and the power connector 66 to the connector 58 may be disposed on different layers of the PCB 14. For example, a trace that connects pin X$1 of the first receiving port 60 to pin P$25 of the connector 58 is disposed along portions of at least two layers of the PCB 14 as the trace travels the PCB 14 in the longitudinal direction (i.e., in the +/−X-direction) to commutatively couple the first receiving port 60 to the connector 58.

Referring to FIG. 1, in some embodiments, the connector 58 is configured to communicate with a data acquisition (DAQ) module 68 or hardware such that the data sent to the connector 58 from the various electrical components connected to the PCB 14 may be determined, analyzed, and the like. It is appreciated that the DAQ module 68 includes a corresponding DAQ module connector 68a that is configured for a cable, a connector, a harness, or the like, to communicatively couple the DAQ module 68 to the connector 58 such that data may be transmitted from the connector 58 to the DAQ module 68. In some embodiments, the first receiving port 60 is configured to receive signals from a vehicle datalink connector (DLC) 70. It is appreciated that the DLC 70 includes a corresponding DLC connector 70a that is configured for a cable, a connector, a harness, or the like, to communicatively couple the DLC 70 to the first receiving port 60 such that data may be transmitted from the DLC 70 to the first receiving port 60. Further, it is appreciated that in some embodiments, the first receiving port 60 may be directly or indirectly connected to the DLC 70 via the DLC connector 70a. Further, In some embodiments, the second receiving port 62 may be configured to communicatively couple to an in-vehicle module 72, such as a DAQ module or a mini-module. It is appreciated that the in-vehicle module 72 includes a corresponding in-vehicle module connector 72a that is configured for a cable, a connector, a harness, or the like, to communicatively couple the in-vehicle module 72 to the second receiving port 62 such that data may be transmitted from the in-vehicle module 72 to the second receiving port 62. As such, it is appreciated that the second receiving port 62 extracts a plurality of analog signals from the in-vehicle module 72 and transmits the analog signals to the connector 58. In some embodiments, the pair of coaxial ports 64 may be communicatively coupled to a vehicle electronic control unit (ECU) 74, a module, and the like. It is appreciated that the ECU 74 includes a corresponding ECU connector 74a that is configured for a cable, a connector, a harness, or the like, to communicatively couple the ECU 74 to the pair of coaxial ports 64 such that data may be transmitted from the ECU 74 to the pair of coaxial ports 64. As such, it is appreciated that each of the pair of coaxial ports 64 may extract a plurality of unfiltered CAN signals from the ECU 74 and transmits the unfiltered CAN signals to the connector 58.

The connector interface assembly 10 is configured to obtain a plurality of operating parameters of a plurality of vehicles without the need for modifying or creating a separate harness connection for each vehicle make and/or model. The connector interface assembly 10 replaces a multiple individual connections between the DAQ module 68 and the DLC 70, the in-vehicle module 72, and the ECU 74. Specifically, previous benchmarking would require at least a first cable connection between the DAQ module 68 and the DLC 70, a second cable connection between the DAQ module 68 and the in-vehicle module 72, a third and fourth cable connections between the DAQ module 68 and the ECU 74. The connector interface assembly 10 replaces the at least first, second, third and fourth cable connectors with a single connection between the connector interface assembly 10 and the DAQ module 68. Further, the connector interface assembly 10 is a separate component from the DAQ module 68 allowing for a reduction in time to connect the various components to the DAQ module 68. Moreover, the connector interface assembly 10 reduces bus load on the DAQ module 68 and improves signal acquisition rates received and processed by the DAQ module 68 from the various vehicle connections (i.e. the DLC 70, the in-vehicle module 72, and/or the ECU 74).

That is, the connector interface assembly 10 is a common junction that may be standardized between various different vehicles/kits to connect a plurality of harnesses, ECUs, and the like from different vehicles/kits through a single interface. As such, the connector interface assembly 10 is configured to receive a plurality of data and transfer the plurality of data to the DAQ module 68 or hardware. Example digital or hi-speed data obtained is operating parameters of the vehicle such as engine speed, torque, fuel efficiency, and the like. Other data obtained is analog data such as temperature, pressure, and the like. It should be appreciated that data obtained may be voltage information, which is then converted to units of measurement.

Further, other data obtained is both digital and analog unfiltered data from the ECU 74 of the vehicle. It should be appreciated that the unfiltered data is data obtained prior to firewall applications, blocking technology, and the like used by various automotive vehicles to prevent certain data or preventing entire data streams from being obtained or captured in its entirety by non-predetermined testing of the vehicle. That is, the unfiltered data from the ECU 74 of the vehicle is data or information about the vehicle parameters that cannot be obtained or accessed directly from the DLC 70 of the vehicle due to the vehicle preventing that data or information from being obtained.

Referring now back to FIGS. 1-3, the first side part 16 of the housing 12 is configured to be coupled to the second side part 18 of the housing 12, and vice versa, such that, when coupled, the PCB 14 is at least partially surrounded between the first side part 16 and the second side part 18 of the housing 12. That is, in the closed configuration, the housing 12 (i.e., the first and second side parts 16, 18) at least partially surrounds the PCB 14. As such, the upper surface 56 of the PCB 14 abuts with and/or makes contact with the first side part 16 of the housing 12. In this configuration, the connector 58 and the first receiving port 60 at least partially protrude from the housing 12. The first opening 32a of the first end portion 24 is configured to receive the connector 58 and the second opening 32b of the second end portion 26 is configured to receive the first receiving port 60. The second port aperture 44 and the pair of coaxial port apertures 40 of the first side part 16 of the housing 12 align with the second receiving port 62 and the pair of coaxial ports 64 of the PCB 14 such that access may be permitted. As such, the access permits connections to communicatively couple wires, harnesses, and the like to each of the second receiving port 62 and the pair of coaxial ports 64 while the PCB 14 is at least partially surrounded within the housing 12.

That is, the PCB 14 is positioned between the first side part 16 and the second side part 18 such that the connector 58 extending from the first end 50 of the PCB 14 extends or protrudes through the first opening 32a and the first receiving port 60 extending from the second end 52 of the PCB 14 extends or protrudes through the second opening 32b of the housing 12. As such, access is provided to the connector 58 and the first receiving port 60. Further, the second receiving port 62, the pair of coaxial ports 64, and the power connector 66 of the PCB 14 extending from the upper surface 56 of the PCB 14 extend or protrude through the second port aperture 44, the pair of coaxial port apertures 40, and the power aperture 42 of the first side part 16 of the housing 12 respectively such that there is access to the pair of coaxial ports 64, the second receiving port 62, and the power connector 66.

The access to the connector 58, the first receiving port 60, the second receiving port 62 and the pair of coaxial ports 64 permits cables, harnesses, and the like to be connected such that data or information may be obtained from the vehicle being tested.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A connector interface assembly comprising:
a housing comprising a first side part and a second side part; and
a printed circuit board comprising a first end having a connector, an opposite second end having a first receiving port, and an upper surface having a second receiving port and a pair of coaxial ports extending therefrom, the second receiving port and the pair of coaxial ports of the upper surface extend in a direction perpendicular to the connector and the first receiving port, the connector is different from the first receiving port;
wherein the printed circuit board is positioned between the first side part and the second side part such that the housing at least partially surrounds the printed circuit board between the first side part and the second side part.

2. The connector interface assembly of claim 1, wherein the first receiving port, the second receiving port, and the pair of coaxial ports are communicatively coupled to the connector.

3. The connector interface assembly of claim 1, wherein the connector is configured to communicate with a module.

4. The connector interface assembly of claim 3, wherein the module is a data acquisition module or hardware.

5. The connector interface assembly of claim 1, wherein the first receiving port is configured to receive signals from a vehicle datalink connector.

6. The connector interface assembly of claim 1, wherein the second receiving port is communicatively coupled to an in-vehicle module.

7. The connector interface assembly of claim 6, wherein the in-vehicle module is a data acquisition module.

8. The connector interface assembly of claim 7, wherein the second receiving port is configured to extract a plurality of analog signals from the in-vehicle module and transmits the plurality of analog signals to the connector.

9. The connector interface assembly of claim 1, wherein the pair of coaxial ports is communicatively coupled to a vehicle to receive unfiltered CAN signals.

10. The connector interface assembly of claim 1, wherein the first receiving port, the second receiving port and the pair of coaxial ports are each communicatively coupled to the connector.

11. The connector interface assembly of claim 1, wherein the housing has a first end portion and a second end portion, the first end portion of the housing is configured to receive the connector and the second end portion of the housing is recessed to receive the first receiving port.

12. The connector interface assembly of claim 1, wherein the first side part of the housing includes a second port aperture and a pair of coaxial port apertures, the second port aperture and the pair of coaxial port apertures align with the second receiving port and the pair of coaxial ports such that access to the second receiving port and the pair of coaxial ports is permitted, wherein the second port aperture and the pair of coaxial port apertures are offset perpendicularly from a first end portion and a second end portion of the housing.

\* \* \* \* \*